(12) United States Patent
Singhal et al.

(10) Patent No.: US 12,348,192 B2
(45) Date of Patent: Jul. 1, 2025

(54) RADIO-FREQUENCY AMPLIFIER CIRCUITRY WITH IMPROVED TRANSMIT AND RECEIVE PERFORMANCE

(71) Applicant: Apple Inc., Cupertino, CA (US)

(72) Inventors: Nitesh Singhal, Santa Clara, CA (US); Bo Yu, San Diego, CA (US); Kefei Wu, San Diego, CA (US)

(73) Assignee: Apple Inc., Cupertino, CA (US)

( * ) Notice: Subject to any disclaimer, the term of this patent is extended or adjusted under 35 U.S.C. 154(b) by 40 days.

(21) Appl. No.: 18/466,116

(22) Filed: Sep. 13, 2023

(65) Prior Publication Data

US 2024/0063759 A1 Feb. 22, 2024

Related U.S. Application Data

(63) Continuation of application No. 17/892,869, filed on Aug. 22, 2022.

(51) Int. Cl.
| | |
|---|---|
| *H04B 1/00* | (2006.01) |
| *H03F 1/26* | (2006.01) |
| *H03F 3/19* | (2006.01) |
| *H04B 1/40* | (2015.01) |

(52) U.S. Cl.
CPC ............... *H03F 1/26* (2013.01); *H03F 3/19* (2013.01); *H04B 1/40* (2013.01); *H03F 2200/09* (2013.01); *H03F 2200/294* (2013.01); *H03F 2200/451* (2013.01)

(58) Field of Classification Search
CPC .......... H03F 1/26; H03F 3/19; H03F 2200/09; H03F 2200/294; H03F 2200/451; H03F 2203/45481; H03F 3/45188; H03F 3/195; H03F 3/62; H03F 3/72; H03F 3/185; H04B 1/40

See application file for complete search history.

(56) References Cited

U.S. PATENT DOCUMENTS

| | | | |
|---|---|---|---|
| 8,390,391 B2 | 3/2013 | Frye et al. | |
| 8,754,712 B2 | 6/2014 | Seebacher et al. | |
| 8,983,398 B2 | 3/2015 | Chang et al. | |
| 9,391,570 B2 | 7/2016 | Kong et al. | |
| 9,425,835 B2* | 8/2016 | Seckin ................ | H03D 7/1458 |
| 9,497,054 B1 | 11/2016 | Li et al. | |

(Continued)

*Primary Examiner* — Ping Y Hsieh
(74) *Attorney, Agent, or Firm* — Treyz Law Group; Jason Tsai

(57) ABSTRACT

Wireless circuitry can have an antenna connected to a transmitting amplifier and a receiving amplifier. The wireless circuitry may be operable in a transmit mode during which only the transmitting amplifier is active and in a receive mode during which only the receiving amplifier is active. The transmitting amplifier may be connected to the antenna via a balun and a radio-frequency coupler without an intervening switch that is enabled during the transmit mode and disabled during the receive mode. The transmitting amplifier may include input transistors, cascode transistors, first switches configured to selectively decouple gate terminals of the cascode transistors from a bias voltage, output capacitors, and second switches configured to selectively decouple the output capacitors from a ground line. The first and second switches are turned on during the transmit mode and are turned off during the receive mode to increase an output impedance of the transmitting amplifier.

20 Claims, 7 Drawing Sheets

(56) References Cited

U.S. PATENT DOCUMENTS

| | | |
|---|---|---|
| 11,094,652 B1* | 8/2021 | Leong .................. H01L 21/4853 |
| 11,095,252 B1 | 8/2021 | Zhao et al. |
| 11,152,905 B2 | 10/2021 | Hu et al. |
| 11,265,038 B1 | 3/2022 | Muharemovic et al. |
| 2009/0289721 A1* | 11/2009 | Rajendran .................. H03F 3/72 |
| | | 330/301 |
| 2015/0061766 A1* | 3/2015 | Fang .................. H03F 3/45632 |
| | | 330/254 |
| 2019/0385781 A1 | 12/2019 | Zhang et al. |
| 2021/0175865 A1* | 6/2021 | Lee .......................... H03F 3/72 |
| 2024/0063758 A1* | 2/2024 | Singhal .................... H03F 3/62 |

* cited by examiner

RADIO-FREQUENCY AMPLIFIER CIRCUITRY WITH IMPROVED TRANSMIT AND RECEIVE PERFORMANCE

This application is a continuation of U.S. patent application Ser. No. 17/892,869, filed Aug. 22, 2022, which is hereby incorporated by reference herein in its entirety.

FIELD

This disclosure relates generally to electronic devices and, more particularly, to electronic devices with wireless communications circuitry.

BACKGROUND

Electronic devices can be provided with wireless communications capabilities. An electronic device with wireless communications capabilities has wireless communications circuitry with one or more antennas. Wireless transceiver circuitry in the wireless communications circuitry uses the antennas to transmit and receive radio-frequency signals.

Radio-frequency signals transmitted by an antenna can be fed through a power amplifier, which is configured to amplify low power analog signals to higher power signals more suitable for transmission through the air over long distances. Radio-frequency signals received at an antenna can be fed through a low noise amplifier, which is configured to amplify low power analog signals to higher power signals for ease of processing at a receiver. It can be challenging to design satisfactory power amplifier and low noise amplifier circuitry for an electronic device.

SUMMARY

An electronic device may include wireless communications circuitry. The wireless communications circuitry may include one or more processors or signal processing blocks for generating baseband signals, a transceiver for upconverting (modulating) the baseband signals to radio frequencies and for downconverting (demodulating) radio-frequency signals to baseband signals, a radio-frequency power amplifier for amplifying radio-frequency signals prior to transmission at one or more antennas, and a radio-frequency low noise amplifier for amplifying radio-frequency signals received at one or more antennas in the electronic device.

An aspect of the disclosure provides a radio-frequency amplifier that includes a first input transistor having a gate terminal configured to receive a radio-frequency signal and having a source-drain terminal connected to a first amplifier output terminal, a second input transistor having a gate terminal configured to receive the radio-frequency signal and having a source-drain terminal connected to a second amplifier output terminal, a first capacitor connected to the first amplifier output terminal, a second capacitor connected to the second amplifier output terminal, a first switch configured to selectively decouple the first capacitor from a ground line, and a second switch configured to selectively decouple the second capacitor from the ground line. The first capacitor can have a first terminal connected to the first amplifier output terminal and can have a second terminal connected to the ground line via the first switch. The second capacitor can have a first terminal connected to the second amplifier output terminal and can have a second terminal connected to the ground line via the second switch. The first and second switches can be turned on during a transmit mode and can be turned off during a receive mode.

The radio-frequency amplifier can further include: a first cascode transistor having a first source-drain terminal connected to the source-drain terminal of the first input transistor, a second source-drain terminal connected to the first amplifier output terminal, and a gate terminal configured to receive a bias voltage; a second cascode transistor having a first source-drain terminal connected to the source-drain terminal of the second input transistor, a second source-drain terminal connected to the second amplifier output terminal, and a gate terminal configured to receive the bias voltage; a third switch configured to selectively decouple the gate terminal of the first cascode transistor from the bias voltage; and a fourth switch configured to selectively decouple the gate terminal of the second cascode transistor from the bias voltage. The third and fourth switches can be turned on during a transmit mode and can be turned off during a receive mode. The radio-frequency amplifier can further include a balun having a first terminal connected to the first amplifier output terminal, a second terminal connected to the second amplifier output terminal, and a center tap terminal connected to a supply voltage that is driven high during a transmit mode and during a receive mode.

An aspect of the disclosure provides a radio-frequency amplifier that includes: a first input transistor having a gate terminal configured to receive a radio-frequency signal and having a source-drain terminal connected to a first amplifier output terminal; a second input transistor having a gate terminal configured to receive the radio-frequency signal and having a source-drain terminal connected to a second amplifier output terminal; a first cascode transistor having a first source-drain terminal connected to the source-drain terminal of the first input transistor, a second source-drain terminal connected to the first amplifier output terminal, and a gate terminal configured to receive a bias voltage; a second cascode transistor having a first source-drain terminal connected to the source-drain terminal of the second input transistor, a second source-drain terminal connected to the second amplifier output terminal, and a gate terminal configured to receive the bias voltage; a first switch configured to selectively decouple the gate terminal of the first cascode transistor from the bias voltage; and a second switch configured to selectively decouple the gate terminal of the second cascode transistor from the bias voltage. The first and second switches can be turned on during a transmit mode and can be turned off during a receive mode. The amplifier of claim 10 can further include a first capacitor connected to the first amplifier output terminal, a second capacitor connected to the second amplifier output terminal, a third switch configured to switch the first capacitor in and out of use, and a fourth switch configured to switch the second capacitor in and out of use. The amplifier can further include a balun circuit having a first terminal connected to the first amplifier output terminal, a second terminal connected to the second amplifier output terminal, and a center tap terminal connected to a supply voltage that is driven high during a transmit mode and during a receive mode.

An aspect of the disclosure provides wireless circuitry that includes: a transmitting amplifier having an amplifier output connected to an antenna; a radio-frequency coupler connected between the amplifier output and the antenna; and a balun connected to the amplifier output. The balun can include a primary winding having a turn and a secondary winding having an outer turn that at least partially overlaps with the turn of the primary winding and having an inner turn surrounded by the outer turn. The transmitting amplifier can include an input transistor having a gate terminal configured to receive a radio-frequency signal and having a source-drain terminal connected to the amplifier output, a cascode transistor connected between the input transistor and the amplifier output, a first switch configured to selectively decouple a gate terminal of the cascode transistor from a bias voltage, a capacitor connected to the amplifier output, and a second switch configured to selectively decouple the capacitor from a power supply line. The outer turn of the secondary winding can have a first width, and the inner turn of the secondary winding can have a second width greater than the first width. The transmitting amplifier can be connected to the antenna without an intervening switch that is enabled during a transmit mode and that is disabled during a receive mode.

DETAILED DESCRIPTION

Figure 1:
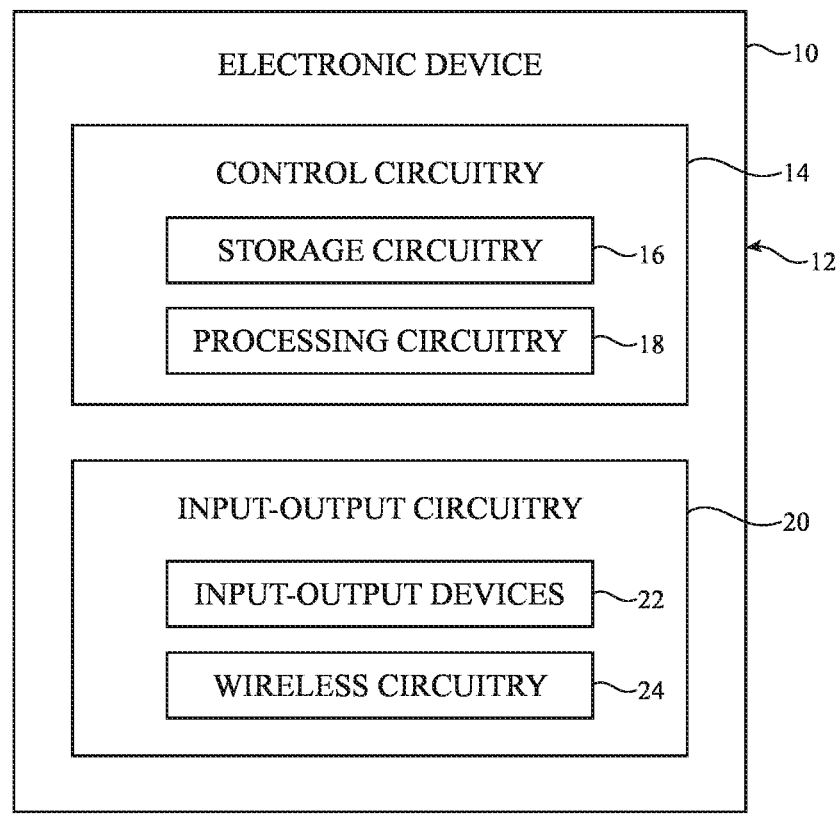
FIG. 1 is a diagram of an illustrative electronic device having wireless circuitry in accordance with some embodiments.

An electronic device such as device 10 of FIG. 1 may be provided with wireless circuitry. The wireless circuitry may include an antenna, a radio-frequency transmitting amplifier configured to amplify radio-frequency signals for transmission at the antenna, and a radio-frequency receiving amplifier configured to amplify radio-frequency signals received by the antenna. The transmitting amplifier may be coupled to the antenna via a balun and a radio-frequency coupler. The radio-frequency coupler may be coupled to the antenna without an intervening transmit enable switch. The balun may provide an electrostatic discharge path for the antenna, which obviates the need for a separate electrostatic discharge inductor in the receive path. The wireless circuitry may be operable in a transmit mode during which the transmitting amplifier is active to transmit radio-frequency signals and may be operable in a receive mode during which the receiving amplifier is active to receive radio-frequency signals.

The balun may be configured to provide a low loss load-pull matching in the transmit mode and to provide a high impedance from the perspective of the antenna in the receive mode. The transmit amplifier can be configured to provide a high output impedance when it is deactivated during the receive mode. The supply voltage of the transmit amplifier may be kept high during the receive mode to boost the output impedance of the transmit amplifier. The transmit amplifier may have output capacitors that are selectively switched out of use during the receive mode to reduce the capacitance at the output port of the transmit amplifier, thereby boosting the output impedance of the transmit amplifier. The transmit amplifier may have amplifier cascode transistors with gate terminals that are selectively decoupled from a virtual ground node during the receive mode to reduce the parasitic capacitance seen at the output port of the transmit amplifier during the receive mode, thereby boosting the output impedance of the transmit amplifier during the receive mode. Configured and operated in this way, the radio-frequency receiving amplifier can be separately optimized to provide improved noise figure performance.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
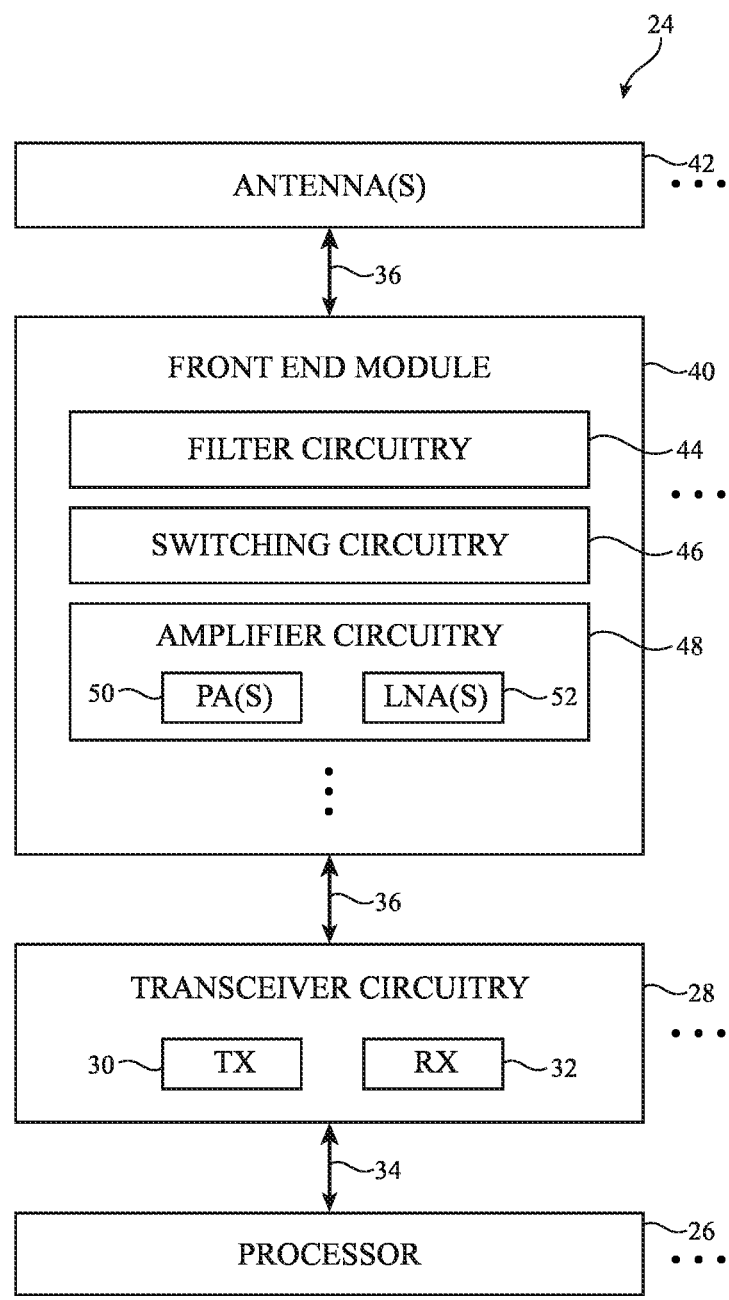
FIG. 2 is a diagram of illustrative wireless circuitry having radio-frequency amplifiers in accordance with some embodiments.

FIG. 2 is a diagram showing illustrative components within wireless circuitry 24. As shown in FIG. 2, wireless circuitry 24 may include a processor such as processor 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, application processor, general purpose processor, microprocessor, microcontroller, digital signal processor, host processor, application specific signal processing hardware, or other type of processor. Processor 26 may be coupled to transceiver 28 over path 34. Transceiver 28 may be coupled to antenna 42 via radio-frequency transmission line path 36. Radio-frequency front end module 40 may be disposed on radio-frequency transmission line path 36 between transceiver 28 and antenna 42.

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, processor 26 may provide transmit signals (e.g., digital or baseband signals) to transceiver 28 over path 34. Transceiver 28 may further include circuitry for converting the transmit (baseband) signals received from processor 26 into corresponding radio-frequency signals. For example, transceiver circuitry 28 may include mixer circuitry for up-converting (or modulating) the transmit (baseband) signals to radio frequencies prior to transmission over antenna 42. The example of FIG. 2 in which processor 26 communicates with transceiver 28 is merely illustrative. In general, transceiver 28 may communicate with a baseband processor, an application processor, general purpose processor, a microcontroller, a microprocessor, or one or more processors within circuitry 18. Transceiver circuitry 28 may also include digital-to-analog converter (DAC) and/or analog-to-digital converter (ADC) circuitry for converting signals between digital and analog domains. Transceiver 28 may use transmitter (TX) 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry such as receiver (RX) 32 for receiving signals from front end module 40 and for converting the received radio-frequency signals into corresponding baseband signals. For example, transceiver 28 may include mixer circuitry for down-converting (or demodulating) the received radio-frequency signals to baseband frequencies prior to conveying the received signals to processor 26 over path 34.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip. If desired, amplifier circuitry 48 and/or other components in front end 40 such as filter circuitry 44 may also be implemented as part of transceiver circuitry 28.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, processor 26 and/or portions of transceiver 28 (e.g., a host processor on transceiver 28) may form a part of control circuitry 14. Control circuitry 14 (e.g., portions of control circuitry 14 formed on processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

Figure 3:
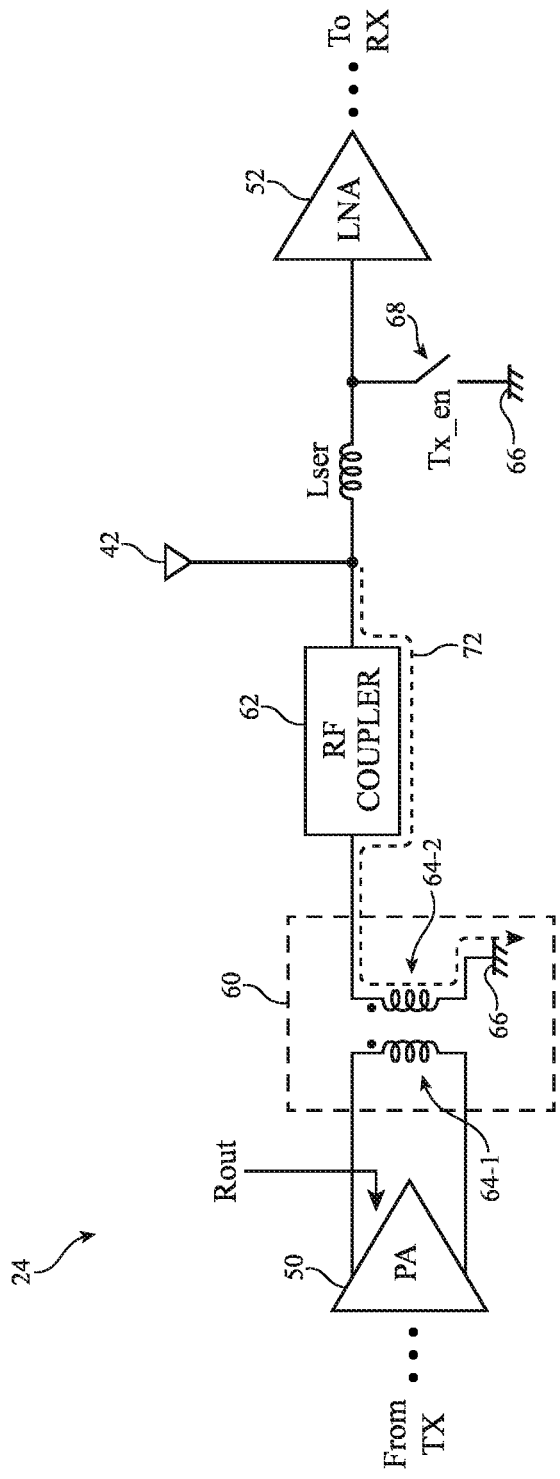
FIG. 3 is a diagram of illustrative wireless circuitry having an antenna coupled to a transmitting amplifier and a receiving amplifier in accordance with some embodiments.

FIG. 3 is a diagram of illustrative wireless circuitry 24 having an antenna 42 that is coupled to a radio-frequency power amplifier 50 and radio-frequency low noise amplifier 52. Amplifier 50 is configured to amplify radio-frequency signals for transmission at antenna 42 and is therefore sometimes referred to as a transmitting amplifier or a radio-frequency (RF) signal transmission amplifier circuit. Circuits such as a frequency upconversion (modulator) circuit and a digital-to-analog converter (DAC) can be coupled to an input port of amplifier 50. Amplifier 52 is configured to amplify radio-frequency signals received by antenna 42 and is therefore sometimes referred to as a receiving amplifier or a radio-frequency (RF) signal reception amplifier circuit. Circuits such as a frequency downconversion (demodulator) circuit and an analog-to-digital converter (ADC) can be coupled to an output port of amplifier 52.

Wireless circuitry 24 may be operable in a transmit (TX) mode and a receive (RX) mode. When wireless circuitry 24 is operated in the transmit mode, transmitting amplifier 50 may be active (enabled or switched into use) while receiving amplifier 52 may be idle (deactivated or switched out of use). When wireless circuitry 24 is operated in the receive mode, receiving amplifier 52 may be active (enabled or switched into use) while transmitting amplifier 50 may be idle (disabled or switched out of use).

As shown in FIG. 3, transmitting amplifier 50 may be connected to antenna 42 via a balun circuit such as balun 60 and a radio-frequency coupler 62. Balun 60 may include a primary coil (winding) 64-1 having terminals connected to differential output ports of transmitting amplifier 50 and may include a secondary coil (winding) 64-2 having a first terminal connected to radio-frequency coupler 62 and having a second terminal connected to ground line 66 (e.g., a ground power supply terminal on which a ground voltage is provided). In accordance with an embodiment, radio-frequency coupler 62 may be connected to antenna 42 without an intervening transmit enable switch (i.e., a series switch that is selectively activated during the transmit mode for connecting coupler 62 to antenna 42 and disabled during the receive mode for disconnecting coupler 62 from antenna 42). Radio-frequency coupler 62 is optionally directly connected to antenna 42. Connected in this way, secondary coil 64-2 can provide an electrostatic discharge path (see ESD path 72) for antenna 42. As a result, a separate ESD discharge path need not be included in the receive path (i.e., the receive path does not include any dedicated ESD shunting inductor).

Antenna 42 may be connected to an input port of receiving amplifier 52 via radio-frequency front-end components such as series inductor Lser and a grounding switch 68. Series inductor Lser may have a first terminal coupled to antenna 42 and a second terminal coupled to grounding switch 68. Grounding switch 68 may be controlled by a transmit enable signal Tx_en, which is asserted during the transmit mode to shunt the second terminal of series inductor Lser to ground line 66. Activating grounding switch 68 can serve to switch receiving amplifier 52 out of use (i.e., to deactivate the receive path). Moreover, the secondary coil 64-2 of balun 60 can act as a short circuit at lower frequencies, which can also help to reject signals from certain frequencies in the receive mode.

Figure 4:
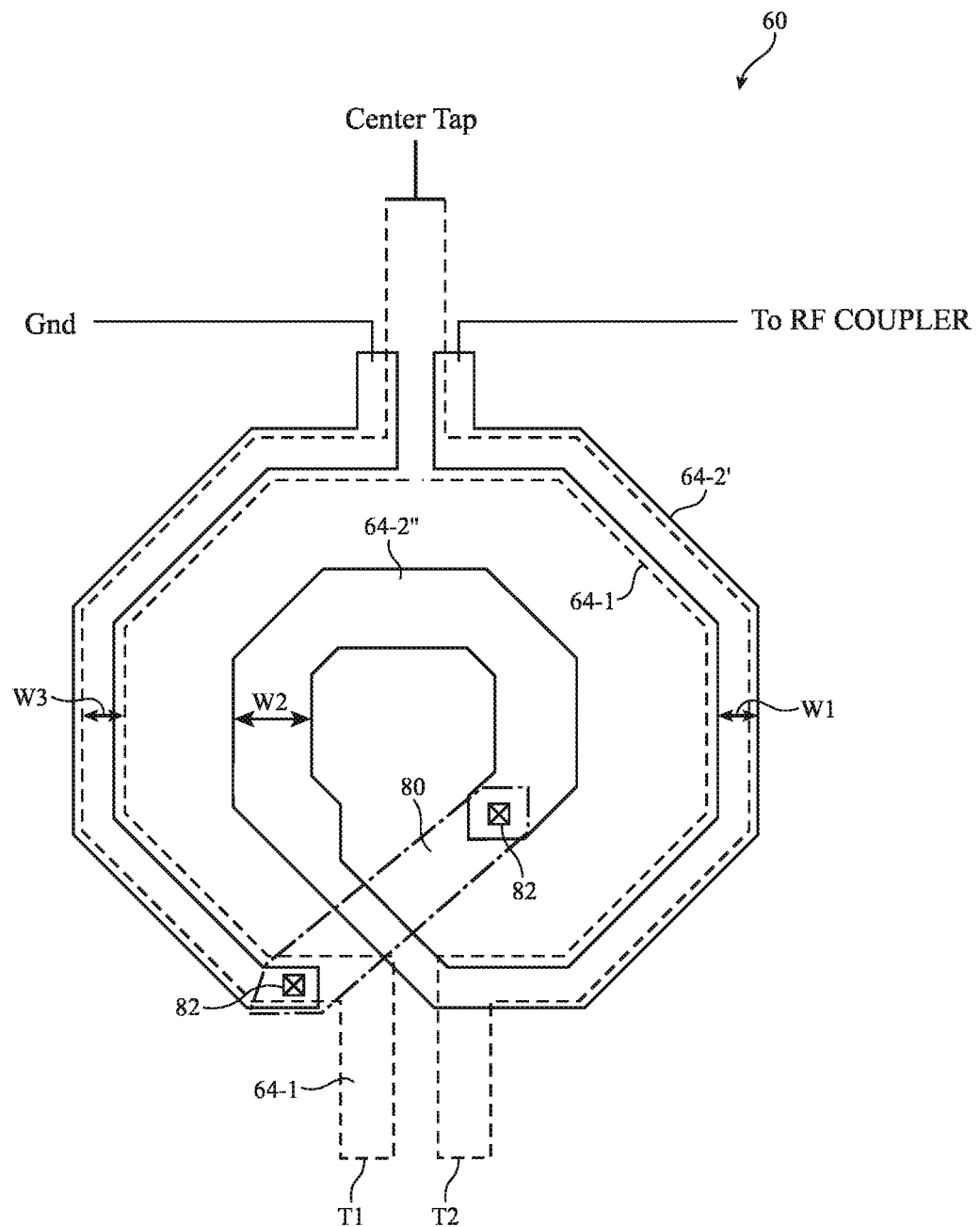
FIG. 4 is a top (plan) view of an illustrative balun circuit in accordance with some embodiment.

As described above, grounding switch 68 can be used to selectively disable the receive path. Radio-frequency coupler 62 is, however, coupled to antenna without any intervening transmit path enabling switch. Antenna 42 is therefore coupled to balun 60 in either the transmit mode or the receive mode. As a result, balun 60 needs to be designed to provide a low loss load-pull matching in the transmit mode and to provide a high impedance from the perspective of antenna 42 in the receive mode. FIG. 4 is a top (plan) view showing an illustrative layout of balun 60 that can provide a low loss load-pull matching in the transmit mode and a high impedance from the perspective of antenna 42 in the receive mode.

As shown in FIG. 4, balun 60 may include a primary winding (coil) 64-1 having only a single turn and having input terminals T1 and T2 and a center tap. The center tap of balun 60 may be connected to an amplifier power supply terminal configured to receive supply voltage Vsup provided on power supply terminal 67. Balun 60 may further include a secondary winding (coil) 64-2 having two turns. The secondary winding can have a first output terminal connected to the radio-frequency coupler (see, coupler 62 in FIG. 3) and a second output terminal connected to ground. In particular, in the 2D top view, the secondary winding of balun 60 may have an outer turn 64-2' that at least partially overlaps with primary winding 64-1 (e.g., the outer turn of coil 64-2 has a portion that extends over or under the single turn of coil 64-1) and may have an inner turn 64-2''' that is non-overlapping with primary winding 64-1. The outer turn 64-2' of the secondary winding and the single turn of the primary winding is formed in different metal routing layers. The outer turn 64-2' of the secondary winding may be coupled to the inner turn 64-2'' through an overpass or underpass structure 80 and respective vias 82. Outer turn 64-2' of the secondary coil may be formed using windings of a first width W1. In contrast, the inner turn 64-2'' of the secondary coil may be formed using windings of a second width W2 that is different than the first width W1. In the example of FIG. 4, second width W2 is larger than the first width W1. Configured in this way, balun 60 can provide an elevated balun inductance transformation ratio of close to 1:2, a low loss load-pull matching in the transmit mode, and a high impedance from the perspective of antenna 42 in the receive mode.

The structure of balun 60 shown in FIG. 4 is illustrative and is not intended to limit the scope of the present embodiments. In another embodiment, the width W1 of the outer turn 64-2' can be greater than the width W2 of the inner turn 64-2". In another embodiment, the primary winding might only overlap the inner winding 64-2" of the secondary coil. If desired, the primary winding 64-1 of balun 60 can have more than one turn, can have at least two turns, at least three turns, two to five turns, or more than five turns. If desired, the secondary winding of balun 60 can have only one turn, can have more than two turns, can have at least three turns, two to five turns, or more than five turns. The number of turns in primary winding 64-1 can be different than the number of turns in secondary winding 64-2. The number of turns in primary winding 64-1 can optionally be the same as the number of turns in secondary winding 64-2. If desired, the width of the windings in the inner, outer, or intermediate turns can be varied or can be the same. If desired, a portion of primary coil 64-1 can overlap with a respective portion of secondary coil 64-2.

Since the magnetic coupling between the primary winding 64-1 and the secondary winding 64-2 of balun 60 remains intact during the receive mode, transmitting amplifier 50 has an output impedance that is seen on secondary winding 64-2 (see, e.g., power amplifier output resistance Rout in FIG. 3). As a result, transmitting amplifier 50 needs to provide a high output impedance Zout even when it is turned off during the receive mode.

Figure 5:
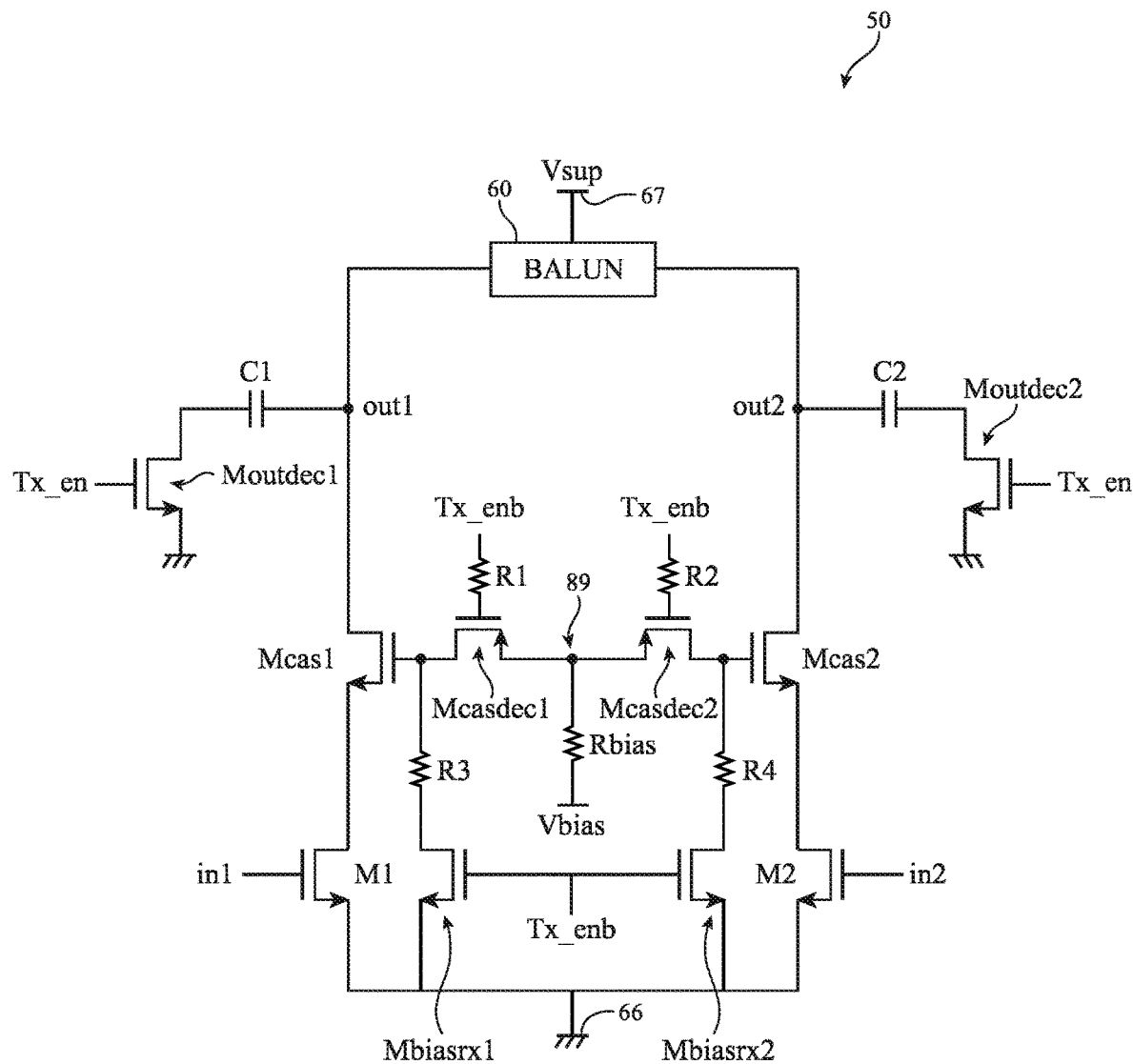
FIG. 5 is circuit diagram of an illustrative radio-frequency transmitting amplifier in accordance with some embodiments.

FIG. 5 is circuit diagram of illustrative radio-frequency transmitting amplifier 50. As shown in FIG. 5, transmit amplifier 50 may include input transistors such as input transistors M1 and M2 (e.g., n-type metal-oxide-semiconductor or NMOS devices), cascode transistors such as cascode transistor Mcas1 and Mcas2 (e.g., NMOS devices), and balun 60. Input transistor M1 has a source terminal coupled to ground power supply line 66, a gate terminal coupled to a first amplifier input terminal in1, and a drain terminal. Similarly, input transistor M2 has a source terminal coupled to ground power supply line 66, a gate terminal coupled to a second amplifier input terminal in2, and a drain terminal. Input terminals in1 and in2 collectively form a differential input port for transmitting amplifier 50.

Cascode transistor Mcas1 has a source terminal coupled to the drain terminal of input transistor M1, a gate terminal configured to receive a cascode bias voltage, and a drain terminal output to a first amplifier output terminal out1. Similarly, cascode transistor Mcas2 has a source terminal coupled to the drain terminal of input transistor M2, a gate terminal configured to receive the cascode bias voltage, and a drain terminal output to a second amplifier output terminal out2. Output terminals out1 and out2 collectively form a differential output port for transmitting amplifier 50.

The terms "source" and "drain" are sometimes used interchangeably when referring to current-conducting terminals of a metal-oxide-semiconductor transistor. The source and drain terminals are therefore sometimes referred to as "source-drain" terminals (e.g., a transistor has a gate terminal, a first source-drain terminal, and a second source-drain terminal). A cascode transistor can be defined herein as a transistor having a first source-drain terminal coupled to an input transistor, a second source-drain terminal coupled to an amplifier output port, and a gate terminal configured to receive a bias voltage. Balun 60 (e.g., a balun circuit of the type described in connection with FIGS. 3 and 4) can be coupled across output terminals out1 and out2. Balun 60 can have a center tap terminal configured to receive power supply voltage Vsup.

In accordance with some embodiments, amplifier output terminal out1 can be coupled to a first capacitor C1 that is selectively activated using transistor Moutdec1. Capacitor C1 has a first terminal coupled to out1 and a second terminal coupled to transistor Moutdec1. Transistor Moutdec1 has a drain terminal coupled to the second terminal of C1, a source terminal coupled to ground, and a gate terminal configured to receive transmit enable signal Tx_en. Transmit enable signal Tx_en is only asserted (e.g., driven high) during the transmit mode and is deasserted (e.g., driven low) during the receive mode. Similarly, amplifier output terminal out2 can be coupled to a second capacitor C2 that is selectively activated using transistor Moutdec2. Capacitor C2 has a first terminal coupled to out2 and a second terminal coupled to transistor Moutdec2. Transistor Moutdec2 has a drain terminal coupled to the second terminal of C2, a source terminal coupled to ground, and a gate terminal configured to receive transmit enable signal Tx_en.

Configured in this way, capacitors C1 and C2 can be switched into use (activated) during the transmit mode to provide sufficient load-pull matching during the transmit mode and can be switched out of use (deactivated) during the receive mode. Deactivating capacitors C1 and C2 from out1 and out2 of transmitting amplifier 50 reduces the total amount of capacitance at the amplifier output port, which increases Zout during the receive mode. Transistors Moutdec1 and Moutdec2 can therefore be referred to as output capacitance decoupling switches. Since transistors Moutdec1 and Moutdec2 are turned on during the transmit mode, they experience minimal voltage across their drain-to-source junctions. This allows transistors Moutdec1 and Moutdec2 to be thin-oxide, low threshold voltage devices that offer lower on resistance. Using low threshold voltage devices can provide lower loss during the transmit mode.

The gate terminals of cascode transistors Mcas1 and Mcas2 can be coupled to additional switches such as transistors Mcasdec1 and Mcasdec2 that are selectively activated only during the transmit mode. Transistors Mcasdec1 and Mcasdec2 can be p-type metal-oxide-semiconductor (PMOS) devices, as an example. Transistor Mcasdec1 may have a first source-drain terminal coupled to the gate terminal of cascode transistor Mcas1, a second source-drain terminal coupled to node 89, and a gate terminal configured to receive signal Tx_enb signal via a first resistor R1. Signal Tx_enb may be an inverted version of transmit enable signal Tx_en. Similarly, transistor Mcasdec2 may have a first source-drain terminal coupled to the gate terminal of cascode transistor Mcas2, a second source-drain terminal coupled to node 89, and a gate terminal configured to receive signal Tx_enb signal via a second resistor R2. Node 89 may be coupled to a bias voltage Vbias via a third (bias) resistor Rbias. Bias voltage Vbias can be a ground voltage, a positive power supply voltage, a negative voltage, or some intermediate voltage between a positive power supply voltage and a ground voltage. The cascode bias voltage may be provided on node 89. Node 89 in this arrangement may behave like a virtual ground node.

The cascode transistors Mcas1 and Mcas2 can have large gate-to-drain capacitances that contribute to the total capacitance at the output port of amplifier 50. As described above, reducing the total capacitance at the output port of amplifier 50 can help reduce the output capacitance Cout. Thus, during the receive mode, transistors Mcasdec1 and Mcasdec2 can be turned off (deactivated) to let the gate terminal of the cascode transistors float, which effectively removes the gate-to-drain capacitances of the cascode transistors, thus decreasing the output capacitance of amplifier 50. In the transmit mode, transistors Mcasdec1 and Mcasdec1 are turned on (activated) to reconnect the gate terminal of the cascode transistors to the virtual ground node 89. Transistors Mcasdec1 and Mcasdec2 can therefore be referred to as cascode capacitance decoupling switches. Transistors Mcasdec1 and Mcasdec2 can be implemented using low threshold voltage devices that offer lower on resistance. The use of lower on resistance devices for transistors Mcasdec1 and Mcasdec2 has minimal impact on the transmit performance of amplifier 50. The example of FIG. 5 in which transistors Mcasdec1 and Mcasdec2 are implemented as p-channel transistors is illustrative. If desired, the cascode capacitance decoupling switches Mcasdec1 and Mcasdec2 can be implemented as n-channel transistors controlled by signal Tx_en.

Figure 6:
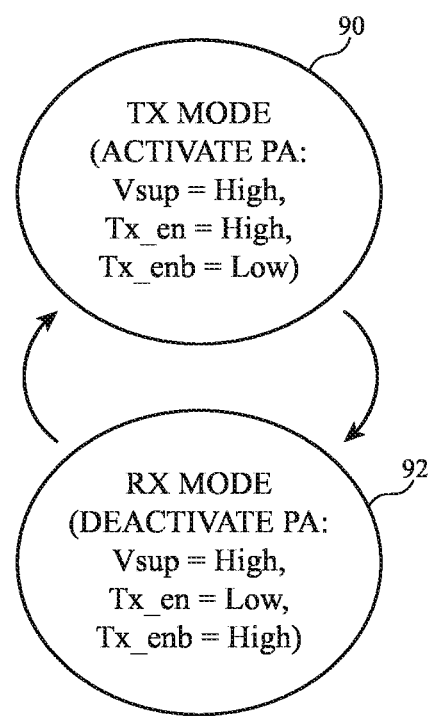
FIG. 6 is a state diagram showing illustrative transmit and receive modes for a radio-frequency transmitting amplifier of the type shown in FIG. 5 in accordance with some embodiments.

FIG. 6 is a state diagram showing illustrative transmit and receive modes for radio-frequency transmitting amplifier 50. As shown in FIG. 6, the transmitting amplifier 50 may toggle between a transmit mode such as TX mode 90 and a receive mode such as RX mode 92. When operated in the transmit mode 90, the transmitting amplifier may be actively amplifying radio-frequency signals, amplifier supply voltage Vsup is driven high to a positive power supply voltage level, and signals Tx_en and Tx_enb are driven high and low, respectively. The high Vsup voltage enables the transmitting amplifier to operate properly. Driving signal Tx_en high turns on switches Moutdec1 and Moutdec2, which switches output capacitors C1 and C2 into use so that C1 and C2 can provide the desired load-pull matching during the transmit mode. Driving signal Tx_en also turns on grounding switch 68 (see FIG. 3), which disables the receive path. Driving signal Tx_enb low turns on switches Mcasdec1 and Mcasdec2, which allows the cascode transistors Mcas1 and Mcas2 to receive the bias voltage from node 89. Switches Mcasdec1 and Mcasdec2 do not add any loss in the transmit mode.

Figure 7:
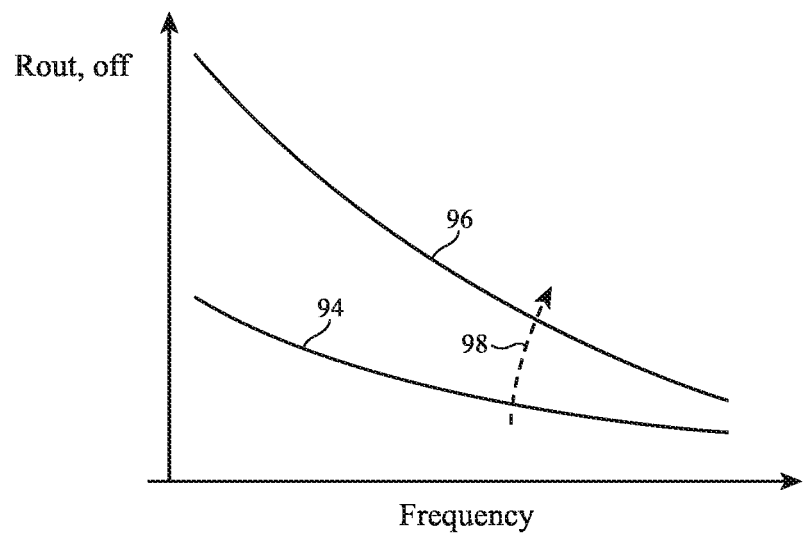
FIG. 7 is a diagram plotting an output impedance of a transmit amplifier as a function of frequency for different supply voltages in accordance with some embodiments.

When operated in the receive mode 92, the transmitting amplifier may be deactivated, amplifier supply voltage Vsup is still driven high to the positive power supply voltage level, and signals Tx_en and Tx_enb are driven low and high, respectively. The high Vsup voltage reverse biases the p-n junction at the drain terminal of the cascode transistors Mcas1 and Mcas2. FIG. 7 is a diagram plotting an equivalent parallel output resistance Rout of transmitting amplifier 50 as a function of frequency for different supply voltages in accordance with some embodiments. In FIG. 7, curve 94 represents an off resistance Rout of amplifier 50 at a first Vsup level and curve 96 represents an off resistance Rout of amplifier 50 at a second Vsup level that is higher than the first Vsup level (arrow 98 shows increasing Vsup levels). As shown in FIG. 7, a higher Vsup level provides an elevated Rout,off level across a wide range of frequencies. Thus, keeping the supply voltage Vsup high during the receive mode can help increase the output impedance of amplifier 50. Keeping Vsup high during the receive mode is conventionally counterintuitive since the supply of the transmit amplifier is typically turned off to save power during the receive mode. During this time, the bias voltage at the gate terminals of the input and cascode transistors can be driven low (e.g., to ground). Since transistors Mcasdec1 and Mcasdec2 are turned off during the receive mode, the low bias voltage to cascode transistors Mcas1 and Mcas2 can be provided by a highly resistive connection to ground. This can be achieved by connecting a small NMOS transistor such as Mbiasrx1 in series with a resistor R3 to the gate terminal of Mcas1. Similarly, a small NMOS transistor such as Mbiasrx2 can be connected in series with a high resistor R4 to the gate terminal of Mcas2. The gate terminals of the transistors Mbiasrx1 and Mbiasrx are controlled by Tx_enb, which is pulled high/low during the receive/transmit mode, respectively. Resistors R1, R2, R3, and R4 should have relatively high resistance values greater than 1 kΩ), greater than 10 kΩ), greater than 100 kΩ), or more than 1 MΩ.

Figure 8:
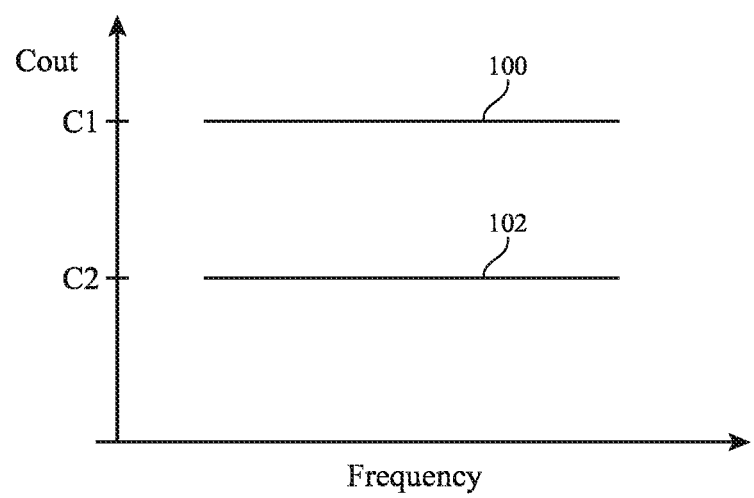
FIG. 8 is a diagram plotting an output capacitance of a transmit amplifier as a function of frequency in different modes in accordance with some embodiments.

Driving signal Tx_en low turns off switches Moutdec1 and Moutdec2, which switches output capacitors C1 and C2 out of use so that C1 and C2 are decoupled from the output port of transmitting amplifier 50, thus increasing the Rout. Driving signal Tx_enb high turns off switches Mcasdec1 and Mcasdec2, which decouples the gate terminals of the cascode transistors from the virtual ground node 89, which removes the gate-to-drain capacitance of the cascode transistors and thus decreases the output capacitance of amplifier 50. This reduction in the effective output capacitance of amplifier 50 (Cout) is shown in FIG. 8. As shown in FIG. 8, line 100 represents a level of Cout during the TX mode, whereas line 102 represents a level of Cout during the RX mode. During the TX mode, switches Moutdec1, Moutdec2, Mcasdec1, and Mcasdec2 are turned on, so Cout will have a high value C1. During the RX mode, switches Moutdec1, Moutdec2, Mcasdec1, and Mcasdec2 will all be turned off, so Cout will have a lower value C2.

The methods and operations described above in connection with FIGS. 1-8 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. An amplifier comprising:
a first input transistor;
a first cascode transistor coupled between the first input transistor and a first output terminal of the amplifier;
a balun coupled to the first output terminal, wherein
during a transmit mode, the amplifier is activated while the balun is configured to receive a positive power supply voltage, and
during a receive mode, the amplifier is deactivated while the balun is configured to receive the positive power supply voltage that reverse biases a p-n junction at a source-drain terminal of the first cascode transistor.

2. The amplifier of claim 1, further comprising:
a second input transistor;
a second cascode transistor coupled between the second input transistor and a second output terminal of the amplifier, wherein the balun is coupled between the first output terminal and the second output terminal.

3. The amplifier of claim 2, further comprising:
a first bias transistor configured to selectively couple a gate terminal of the first cascode transistor to a ground line, wherein the first bias transistor is deactivated during the transmit mode and is activated during the receive mode.

4. The amplifier of claim 3, further comprising:
a second bias transistor configured to selectively couple a gate terminal of the second cascode transistor to the ground line, wherein the second bias transistor is deactivated during the transmit mode and is activated during the receive mode.

5. The amplifier of claim 4, further comprising:
a first resistor coupled between the gate terminal of the first cascode transistor and the first bias transistor; and
a second resistor coupled between the gate terminal of the second cascode transistor and the second bias transistor.

6. The amplifier of claim 2, further comprising:
a first capacitor coupled to the first output terminal; and
a first capacitance decoupling transistor configured to selectively decouple the first capacitor from a ground line, wherein the first capacitance decoupling transistor is activated during the transmit mode and is deactivated during the receive mode.

7. The amplifier of claim 6, further comprising:
a second capacitor coupled to the second output terminal; and
a second capacitance decoupling transistor configured to selectively decouple the second capacitor from the ground line, wherein the second capacitance decoupling transistor is activated during the transmit mode and is deactivated during the receive mode.

8. The amplifier of claim 2, further comprising:
a first bias transistor configured to selectively couple a gate terminal of the first cascode transistor to a bias voltage, wherein the first bias transistor is activated during the transmit mode and is deactivated during the receive mode.

9. The amplifier of claim 8, further comprising:
a second bias transistor configured to selectively couple a gate terminal of the second cascode transistor to the bias voltage, wherein the second bias transistor is activated during the transmit mode and is deactivated during the receive mode.

10. The amplifier of claim 9, further comprising:
a bias resistor having a first terminal configured to receive the bias voltage and having a second terminal coupled to a node between the first and second bias transistors.

11. A method of operating an amplifier, comprising:
with a first input transistor of the amplifier, receiving a radio-frequency signal;
with a first cascode transistor coupled in series with the first input transistor, outputting an amplified radio-frequency signal onto a first output terminal of the amplifier;
with a balun coupled to the first output terminal, receiving a positive power supply voltage for powering the amplifier in a transmit mode during which the amplifier is activated; and
with the balun, receiving the positive power supply voltage for reverse biasing a source-drain terminal of the first cascode transistor in a receive mode during which the amplifier is deactivated.

12. The method of claim 11, further comprising:
with a second input transistor of the amplifier, receiving the radio-frequency signal;
with a second cascode transistor coupled in series with the second input transistor, outputting the amplified radio-frequency signal onto a second output terminal of the amplifier, wherein the balun is coupled between the first and second output terminals.

13. The method of claim 12, further comprising:
with a first switch, selectively coupling a gate terminal of the first cascode transistor to a ground line during the receive mode; and
with a second switch, selectively coupling a gate terminal of the second cascode transistor to the ground line during the receive mode.

14. The method of claim 13, further comprising:
with a third switch, selectively coupling the gate terminal of the first cascode transistor to a bias voltage during the transmit mode; and
with a fourth switch, selectively coupling the gate terminal of the second cascode transistor to the bias voltage during the transmit mode.

15. The method of claim 12, further comprising:
with a first switch, selectively decoupling a first capacitor that is coupled to the first output terminal from a ground line during the receive mode; and
with a second switch, selectively decoupling a second capacitor that is coupled to the second output terminal from the ground line during the receive mode.

16. An amplifier comprising:
a first input transistor coupled between a first output terminal of the amplifier and a ground power supply line, the first input transistor having a first threshold voltage;
a balun coupled to the first output terminal and a positive power supply line;
a first capacitor coupled to the first output terminal; and
a first switching transistor coupled in series with the first capacitor and having a second threshold voltage lower than the first threshold voltage.

17. The amplifier of claim 16, further comprising:
a second input transistor coupled between a second output terminal of the amplifier and the ground power supply line, wherein the balun is coupled between the first and second output terminals;
a second capacitor coupled to the second output terminal; and
a second switching transistor coupled in series with the second capacitor and having a third threshold voltage lower than the first threshold voltage.

18. The amplifier of claim 17, wherein the first and second switching transistors are activated in a transmit mode during which the amplifier is activated and are deactivated in a receive mode during which the amplifier is deactivated.

19. The amplifier of claim 18, wherein the positive power supply line is configured to receive a positive power supply voltage during the transmit mode and during the receive mode.

20. The amplifier of claim 19, further comprising:
a first cascode transistor coupled between the first input transistor and the first output terminal; and
a second cascode transistor coupled between the second input transistor and the second output terminal, wherein the first and second cascode transistors are activated during the transmit mode and are deactivated during the receive mode.

* * * * *